United States Patent [19]
Bok

[11] Patent Number: 4,594,129
[45] Date of Patent: Jun. 10, 1986

[54] INSTALLATION FOR FLOATING TRANSPORT AND PROCESSING OF SUBSTRATES

[76] Inventor: Edward Bok, Burg. Amersfoordtlaan, 1171 DR Badheovedorp, Netherlands

[21] Appl. No.: 700,581
[22] PCT Filed: Jun. 15, 1984
[86] PCT No.: PCT/NL84/00018
§ 371 Date: Dec. 20, 1984
§ 102(e) Date: Dec. 20, 1984
[87] PCT Pub. No.: WO85/00086
PCT Pub. Date: Jan. 3, 1985

[30] Foreign Application Priority Data
Jun. 16, 1983 [NL] Netherlands .................... 8302163

[51] Int. Cl.$^4$ .................... B44C 1/22; C03C 15/00; B32B 31/00
[52] U.S. Cl. .................... 156/630; 156/643; 156/646; 156/229; 156/297; 156/345; 156/494; 156/499
[58] Field of Search .......... 156/285, 382, 494, 499, 156/629, 630, 643, 646, 297, 299, 345, 229; 264/288.4, 291; 425/503

[56] References Cited

U.S. PATENT DOCUMENTS

| 3,747,393 | 7/1973 | Robra | 72/455 |
| 3,819,286 | 6/1974 | Bianchi | 403/31 |
| 3,911,811 | 10/1975 | Adolfsson | 100/295 |
| 4,252,595 | 2/1981 | Yamamoto et al. | 156/345 |
| 4,341,592 | 7/1982 | Shortes et al. | 156/643 |

FOREIGN PATENT DOCUMENTS

| 8300774 | 3/1983 | European Pat. Off. |
| 8401084 | 3/1984 | European Pat. Off. |

Primary Examiner—William A. Powell
Attorney, Agent, or Firm—David H. Semmes; Warren E. Olsen

[57] ABSTRACT

Improved process installation (10) for double floating transport and processing of substrates (30), consisting of successive transporters (18) with process slots (28) positioned in between and tape (80) as transporting means for said substrates (30) and whereby tensioning means (24), (96) and (104) prevent an unallowable deformation of the transporters (18) and tape (80) during the processing with accompanying heat development.

18 Claims, 11 Drawing Figures

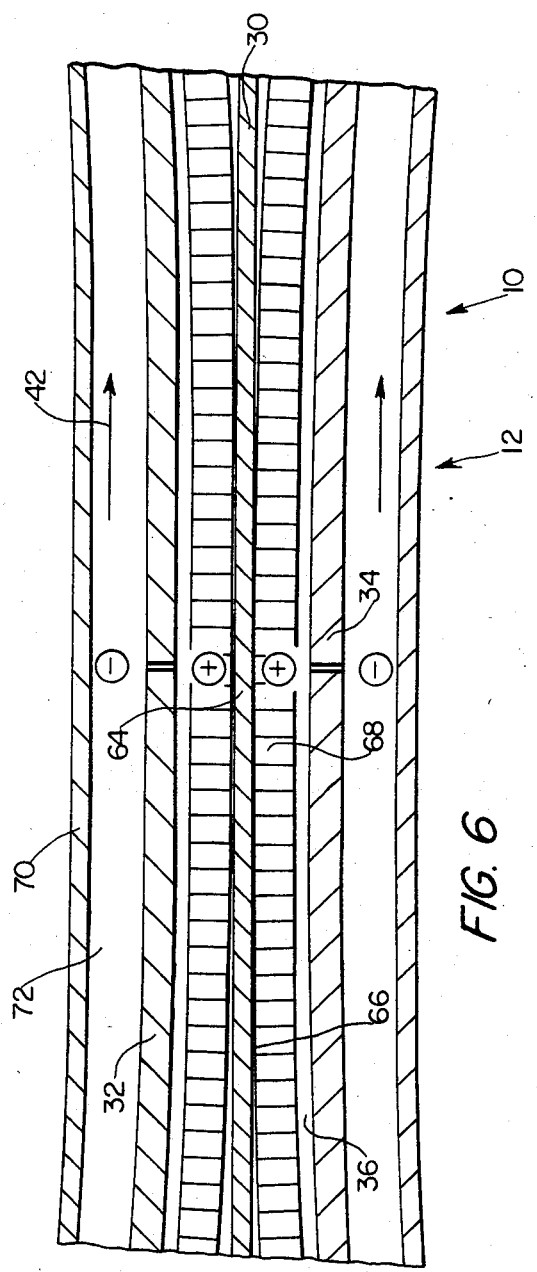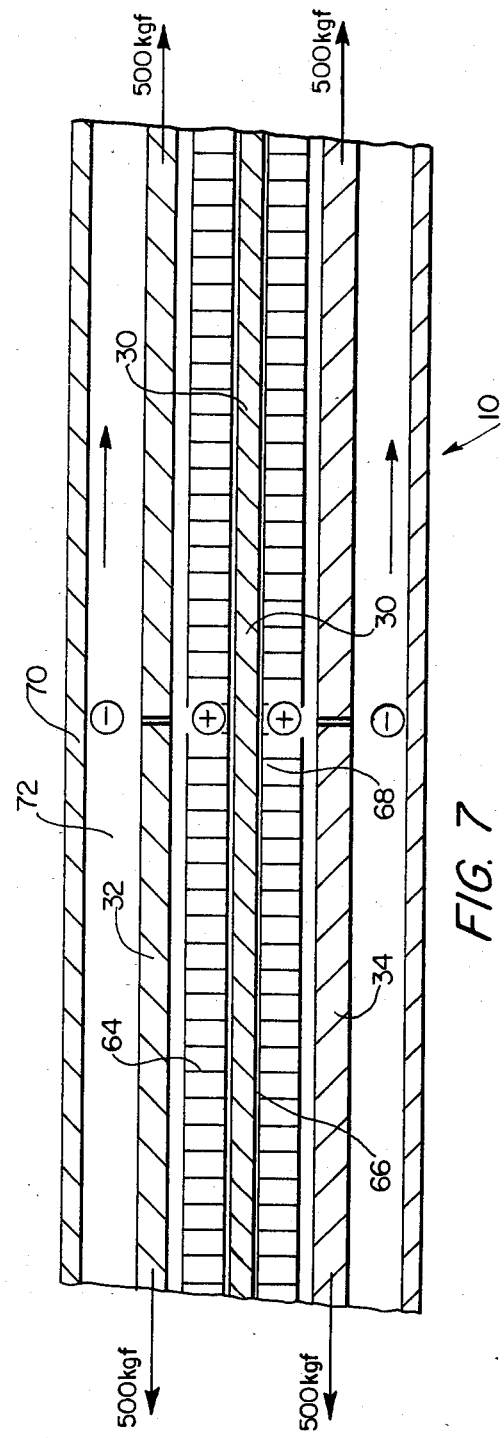

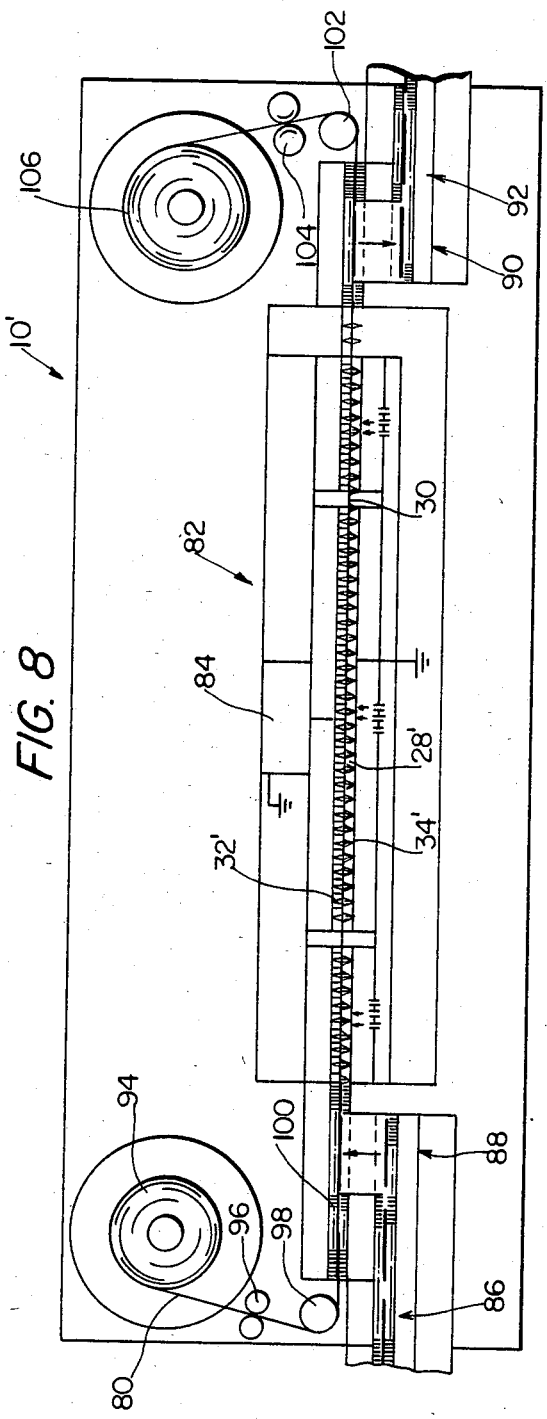

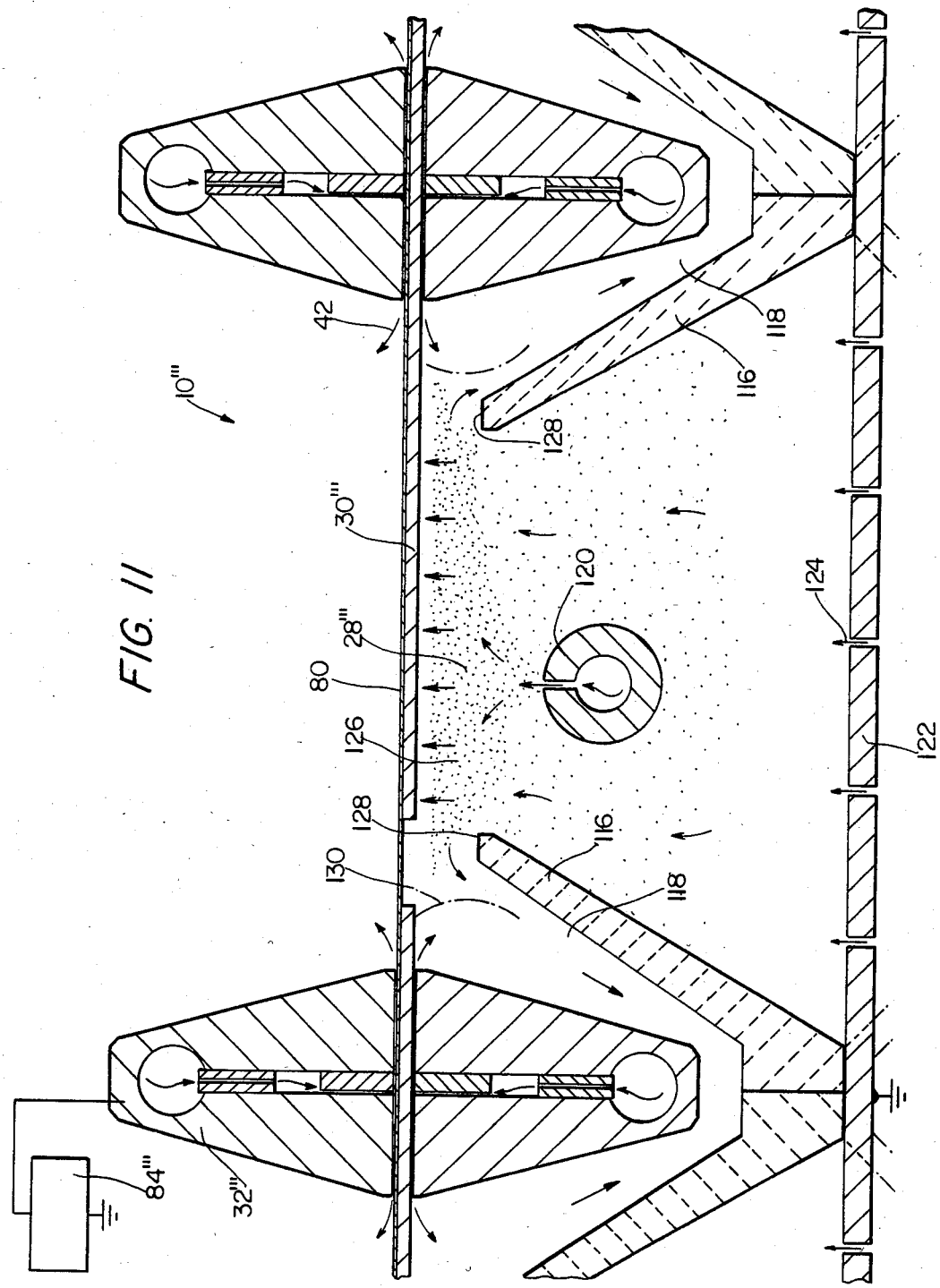

INSTALLATION FOR FLOATING TRANSPORT AND PROCESSING OF SUBSTRATES

The invention relates to processing installations with a double floating transport and processing of substrates.

In the process installations during processing of such substrates heat is induced by the processing medium into the substrates. Such heating takes place in particular with ion implantation, plasma etching, plasma enhanced applying of metal, plasma milling, oxidation systems etcertera. Furthermore heating occurs, in stations as part of a floating transport track, in which processing, such as cleaning and drying of the substrates, takes place.

Thereby the transporters, used preferably for double floating transport of the substrates and located in between successive process slots, function as heaters or coolers of the substrates.

The double floating transport and processing systems for the substrates are described in for instance the Dutch Patent Application Nos. 8 203 318, 8 300 443 and 8 300 649 of the applicant.

Differences in temperature in such transporters result in a considerable bowing of the passage wall-sections of these transporters, with the following disadvantages:

1. a locally critical reduction of the passage width; and
2. a variable heat transfer of the substrates to such transporters.

The installation according to the invention now is characterized in that such transporters are stretched in a longitudinal direction.

Thereby an effective use can be made of a series of hydraulic devices, which urge the mounting frames, as used for a series of transporters away, from each other.

If for the processing of the substrates use is made of a tape, to which these substrates are temporary secured, and whereby processing of both substrates and tape takes place, then the tape can also be considered as a transporter for such substrates.

Thereby such tape acts as an excellent means for heat transfer and consequently such tape is also pre-stressed to prevent a deformation thereof.

Further positive features of the installation follow from the description of the following Figures.

FIG. 6 is a schematic of the transporter structure according to FIG. 1 without stretching forces, applied thereon.

FIG. 7 is a schematic of the transporter structure according to FIG. 6 with applied stretching forces thereon.

FIGS. 8 and 9 show a process installation, in which the combination of substrates and tape are fed through a number of transporters and process slots.

FIG. 10 is an enlarged longitudinal cross-section of two transporters with a processing slot in between.

FIG. 11 is an enlarged longitudinal cross-section of a modified module section with anisotropic plasma etching of substrates, passing through the processing slot.

Figure 1:
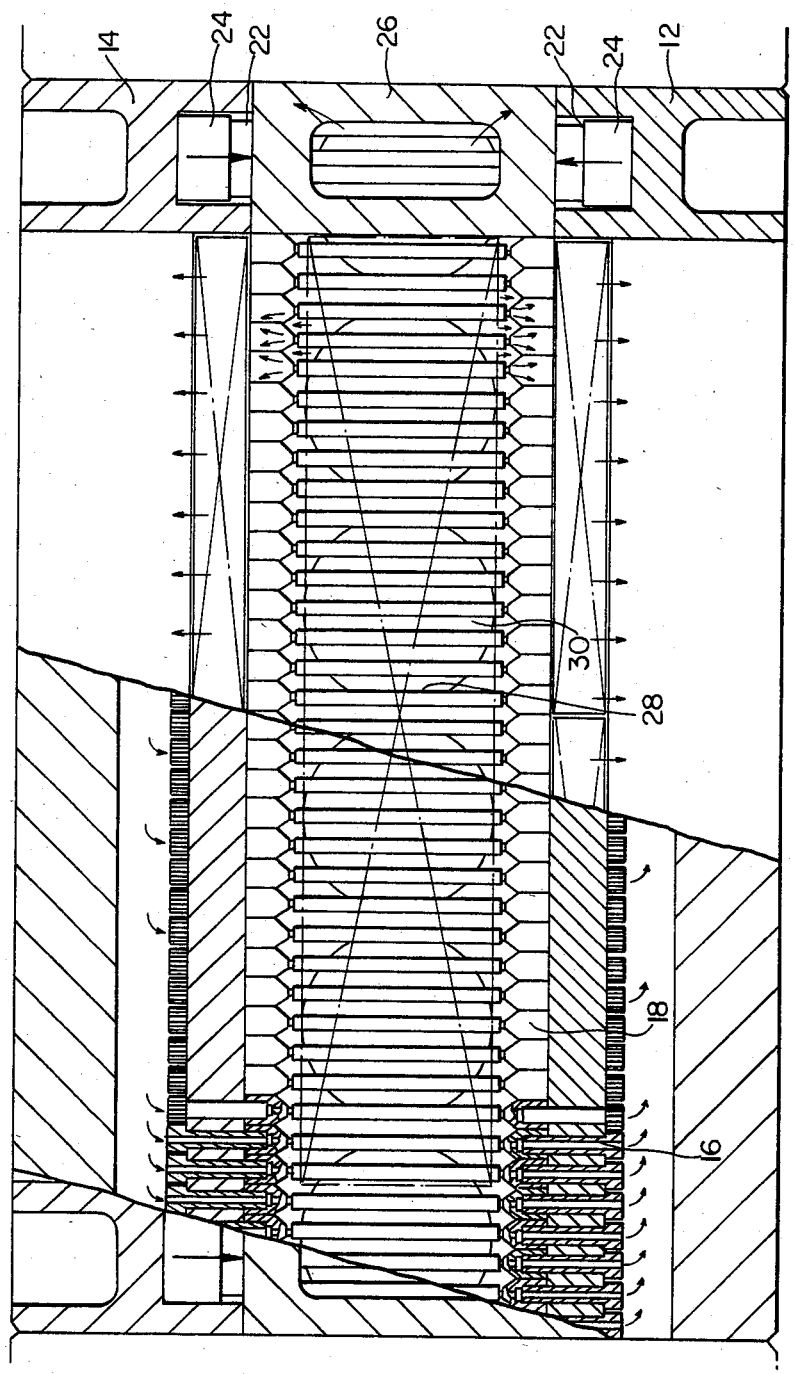
FIG. 1 is a top plan of the installation according to the invention, with therein positioned a series of pre-stressed transporters.

In FIG. 1 the processing installation 10 is shown. Thereby the transporters 18 are by means of the hollow bolts secured to the mounting frames 12 and 14.

In these mounting frames 12 and 14 the contact areas 22 for the hydraulic tensioners 24 are located. These tensioners urge with one end against such frame and with the other end against the blocks 26, which are positioned aside the transporters 18.

In between successive transporters 18 successive processing slots 28 are located, in which processing takes place of the substrates 30, passing through.

Figure 2:
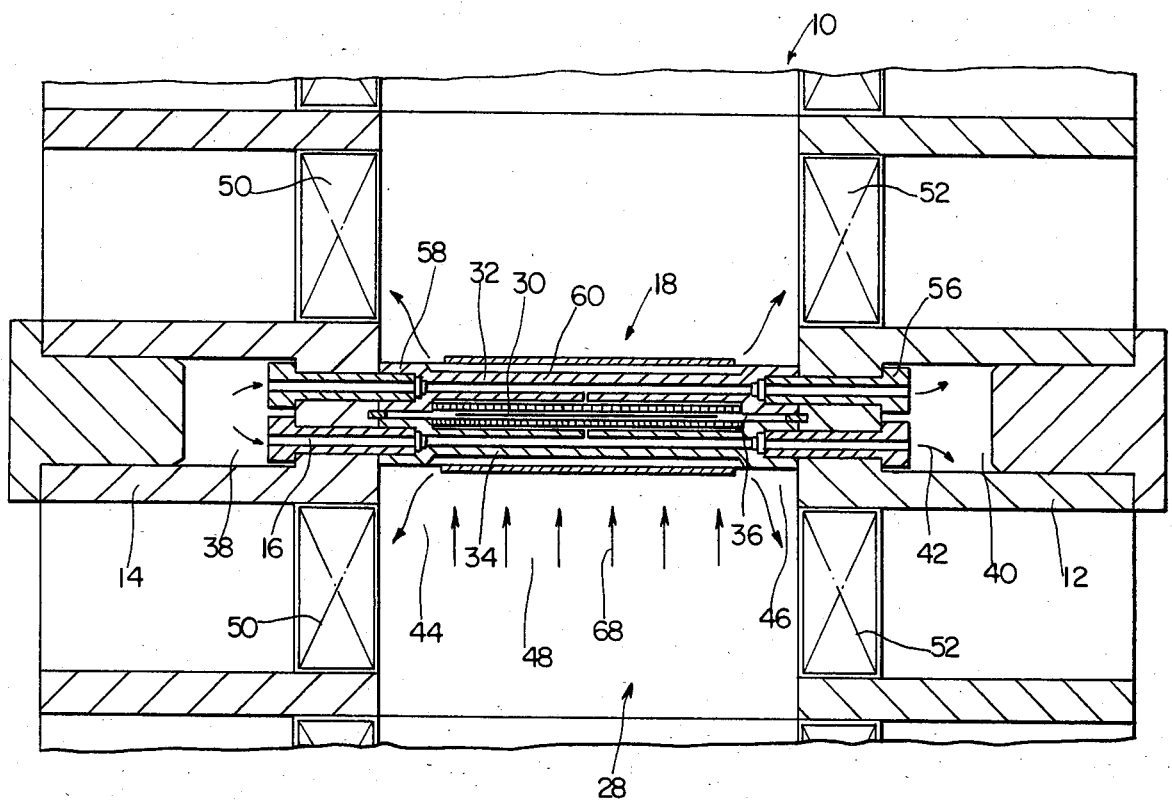
FIG. 2 is a cross section of the installation according to FIG. 1 at the transporter-arrangement.

In FIG. 2 a cross-section of the installation 10 is shown over the transporters 18. Thereby such a transporter consists of the upper section 32 and the lower section 34, with in between located the passage 36 for the substrates 30.

Figure 5:
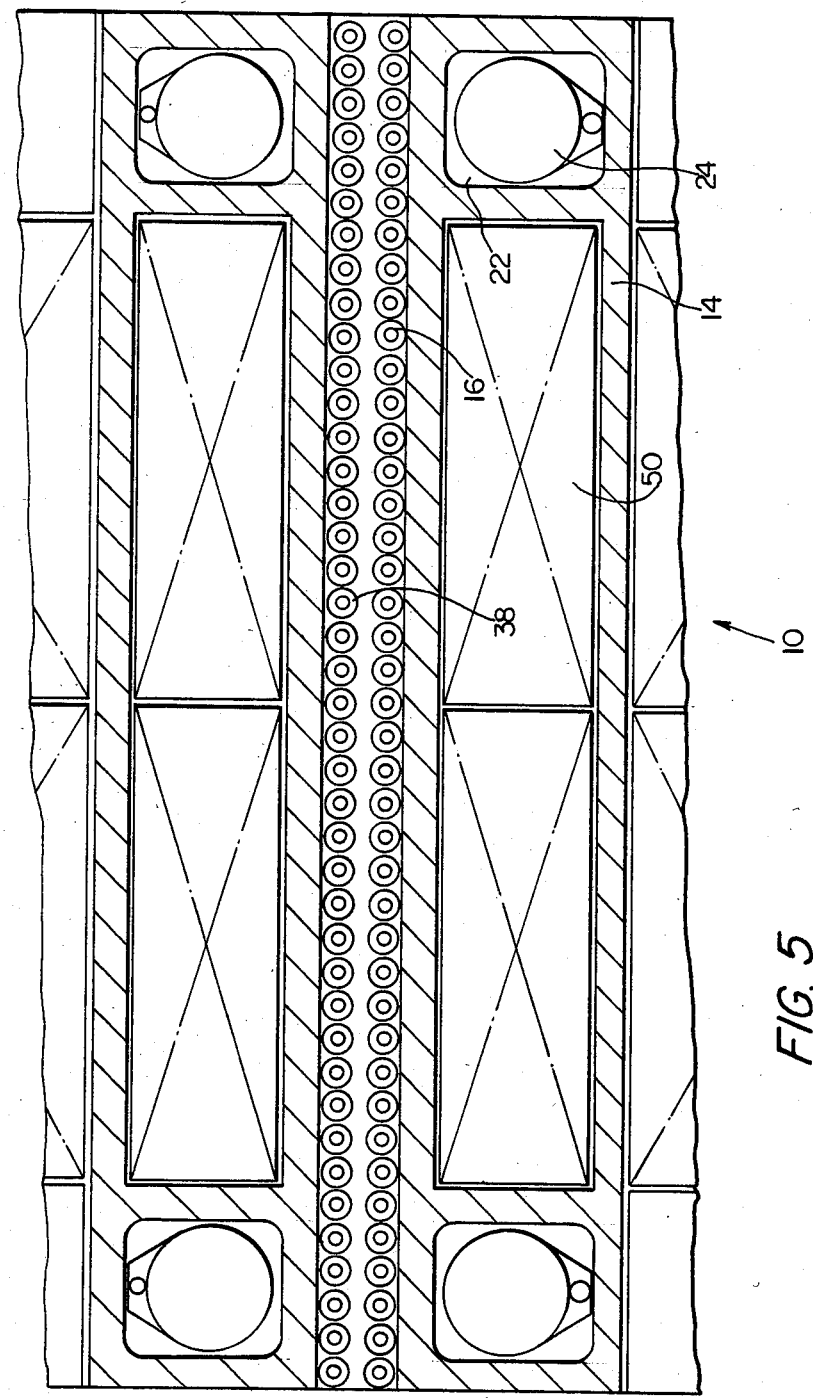
FIG. 5 is a side view of the mounting frame, on which a series of transporters are secured and pre-stressed.

In the frames 12 and 14 the supply channels 38 and the discharge channels 40 for the gaseous transport medium 42 are positioned. These gases flow through the hollow bolts 16, through transporter sections 32 and 34 and the communication chambers 44 and 46, which are located aside the process chamber 48, towards the wide discharge channels 50 and 52 of the respective frames 12 and 14, see also FIG. 5.

Figure 3:
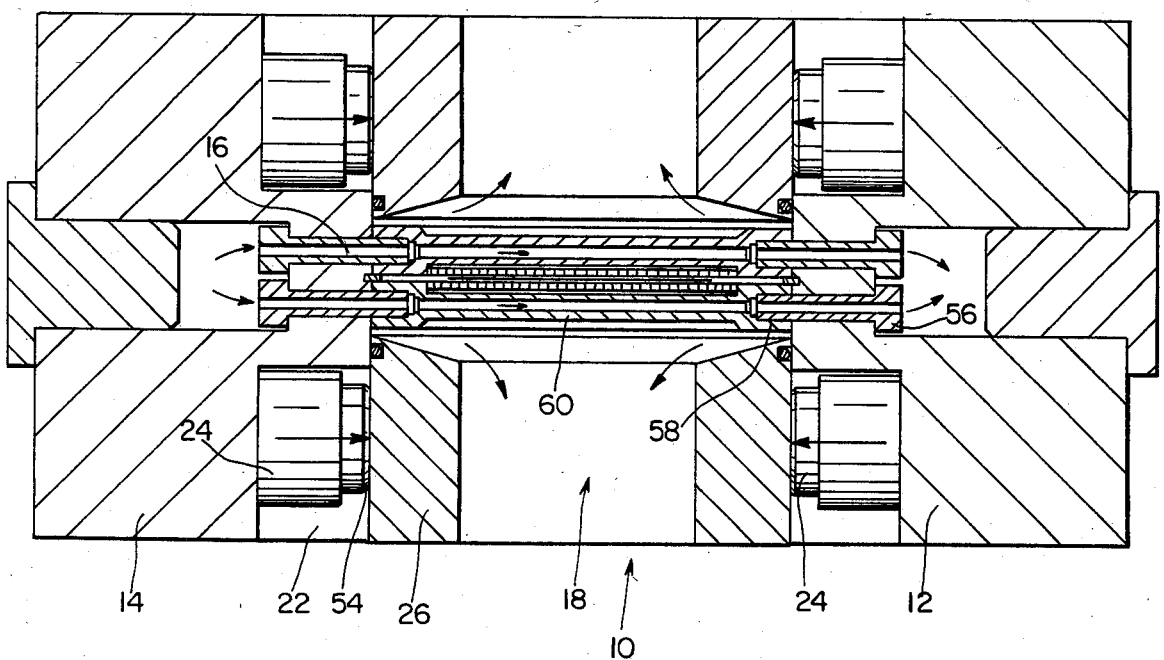
FIG. 3 is a cross section of the installation according to FIG. 1 at the hydraulic tensioning devices.

In FIG. 3 the hydraulic tensioners 24 are shown and whereby these tensioners, urging with their ends 54 against the block 26, establish a displacement of the mounting frames 12 and 14 over a very restricted distance, for instance 100 μm, in sideways direction. Thereby the mounting bolts 16 through their head-end 56 are also displaced over this distance and therewith also the transporter ends 58.

Because the cross-sectional dimensions of the transporter sections 32 and 34 in their mid part 60 are restricted with regard to the length thereof, these sections are stretched by the tension force. A tension force of for instance 1200 kgf, acting on such transporter 18, will correspond with a stretching of the transporter over 100 μm.

Figure 4:
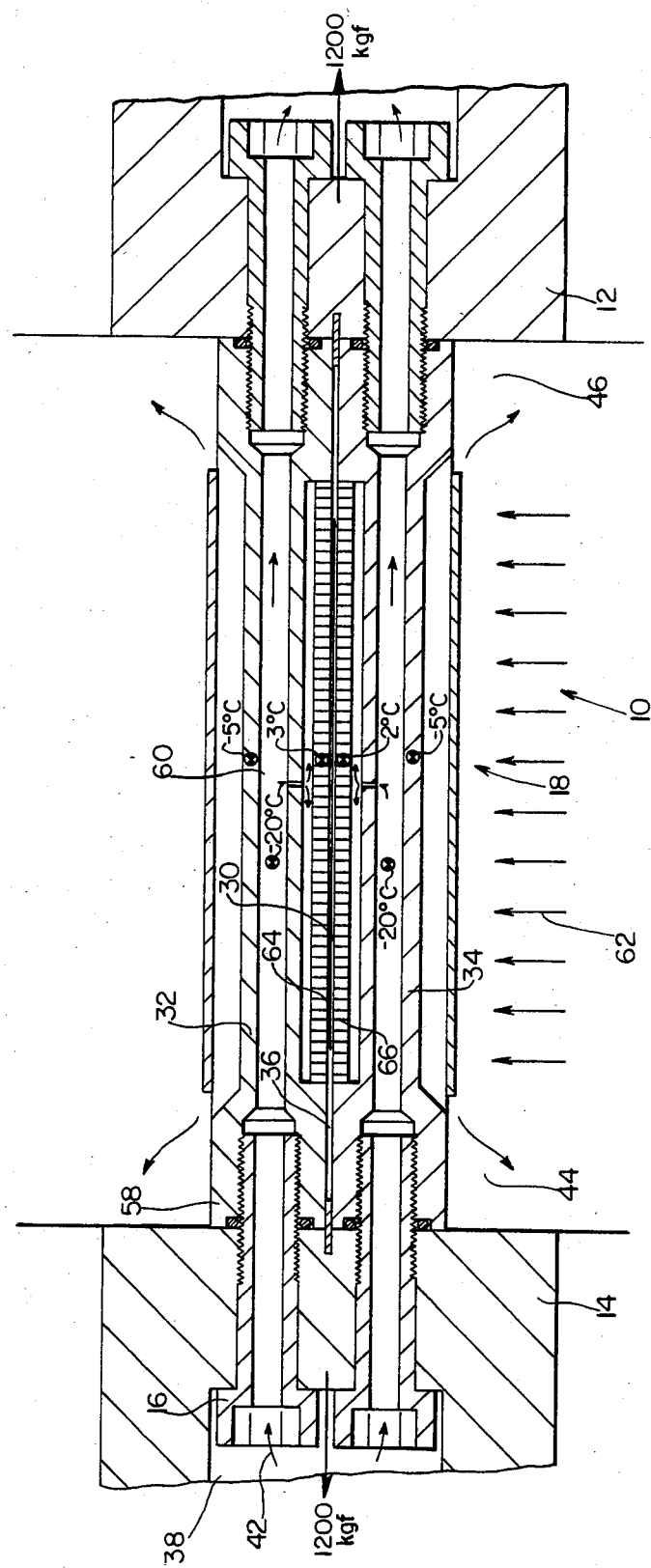
FIG. 4 is an enlarged cross-section of the transporters, as used in the installation according to FIG. 1.

In FIG. 4 such a transporter arrangement 18 is shown in an enlarged cross-sectional view.

During the processing heat is induced by the process gases into the substrate 30. On the outer sides compressed transport gas as cooling medium, having for instance the very low temperature of approximately −20° C., passes through the transporter sections 32 and 34.

Heat transfer takes place from the substrate 30 through the hefty whirling transport gas 42 within the narrow passages 64 and 66 aside this substrate towards each transporter section, whereas the transporter sections take care of the heat transfer towards the cool compressed gas under the establishing of for instance a stabilization temperature of +3° C. in the section 68 near such passages and a temperature of −5° C. in the section 70 near the channels 72 for the gaseous transport gas 42.

In FIG. 6 schematically is shown, how without the stretching of the transporters 18 each section 32 and 34 thereof is deformed as the result of the changes in temperature in these sections, with an indicated bending thereof.

The combined bendings of the transporter sections result in a narrowing of the passages 64 and 66 in the mid-position 60, whereas these passages have a maximum width near the ends thereof.

As as result, a more difficult passing of the substrate takes place through the centre of the passage 36 in combination with a locally increased heat transfer.

Furthermore, great differences are established in the heat transfer through the gases, flowing through the passage-sections with an increased width thereof.

Consequently, even with a restricted heat transfer during processing, this combination of malfunctionings make a correct functioning of the process module impossible.

In FIG. 7 the transporters 18 are stretched by means of the hydraulic tensioners, with such an extent of stretching, that is amply surpasses the local lengthening of the transporter as the result of processing.

As a result, approximately the same width of the passages 64 and 66 can be maintained, with consequently no local worsening of the passing through of the substrate and a constant heat transfer via the gas, whirling through the passges.

In FIG. 8 the module 10' is shown, wherein the combination of substrates 30 and tape 80 passes through the processing module 82.

In this module 82, also with the add of a r.f. generator 84, plasma etching of the substrates, passing through, takes place.

In substrates 30 are supplied by the sender module 86 and in a take-over section 88 are urged onto the tape. The discharge of the substrates occurs in the take-over section 90 and such towards the receiver module 92.

At the entrance of the module the tape 80 is unwound from the roll 94 and fed through the tensioning device 96 to accomplish the stretching of this tape and further along guide roll 98 and through cleaning station 100 fed into the process module.

At the exit of the module the tape 80 is guided along the guide roll 102 and fed through the transport device 104, whereafter this tape is wrapped on roll 106.

By applying a pulling power on the extremely thin tape in this combination of tension device 96 and transporter device 104, a stretching of the tape takes place in longitudinal direction thereof.

Thereby this stretching surpasses the combination of local lengthening of the tape due to the processing, enabling the tape to remain that flat in the module, that a correct resting of the substrates thereon is maintained.

In this installation use can be made of a wide transporter section 32', which is provided with a heating element 108, enabling additional heating of this section. As a result, the width of passage 36' remains almost the same over the entire length thereof. Thereby is affected a possible cooperation with the heating element 110, which is positioned in the transporter section 112.

In FIG. 9 an enlarged fragmentary view is disclosed of a section of a processing module 10''.

The tape 80 consists of at least part thereof of material, conducting electricity. By including this tape together with the substrates in an electric circuitry, an attraction force thereof can be established upon particles in their vicinity.

Because the tape has a greater width than the substrate, it sufficiently covers the transporter section 32'' at the non-processing side.

Consequently, particles from the process chamber 114 cannot be deposited in this section.

Underneath the tape a target arrangement is positioned. By means of ion beams extremely small metal or other particles 116 can be removed from the target and moved towards the chamber 114, whereby these particles bombard the substrate and partly the tape.

If in the processing chamber 114 no substrate section is available, then the tape can still function as collector for these particles.

In this way an effective metal sputtering can take place in the module.

Figure 10:
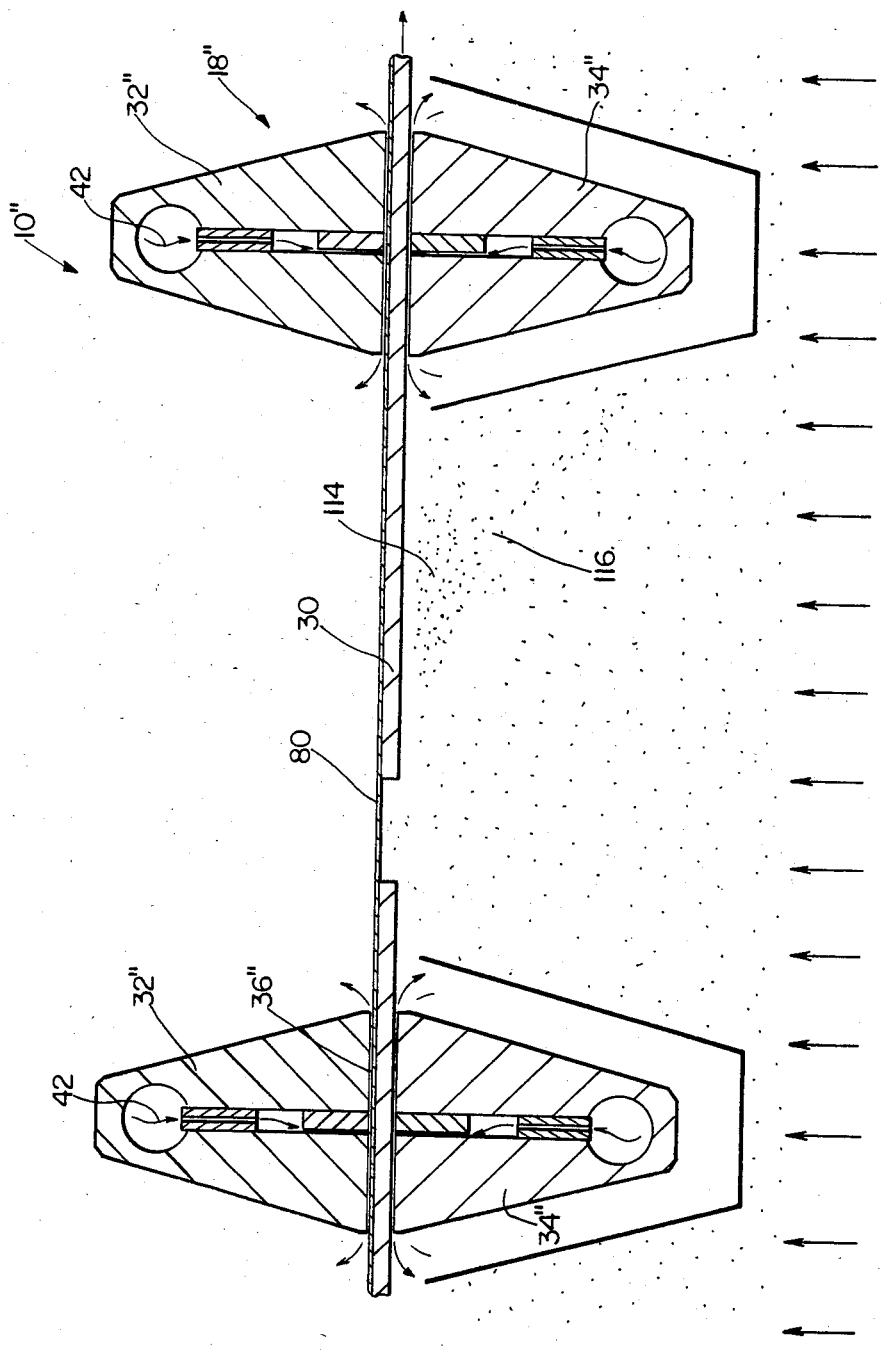

In FIG. 10 the module 10''' is suitable for anisotropic etching, whereby both tape, substrates and transporters are connected with the r.f. generator 84'.

The functioning of these systems is described in the Dutch Patent Application Nos. 8 302 034 and 8 302 035 of the applicant.

Shields 116 funtion both as sidewall for process slot 28''' and sidewall for wide discharge channels 118.

Through tube 120 process gases are fed into this slot as mini process chamber, which furthermore is enclosed by shield wall 122.

In this wall opening are provided, through which carrier gas 124 enters this chamber.

In the chamber the plasma cloud 126 is maintained, which together with the carrier gas 124 moves over edges 128 of shields 116 into the discharge channels.

Thereby the transport gases 42 act as a barrier 130 for this combination of gases.

Within the scope of the invention other structures of the transporters and the processing slots are possible. Furthermore, the installation can be adapted to meet the demands of particular processings.

I claim:

1. Method of tensioning during processing of substrates and tape combrising:
   a. advancing said substrates and tape through a longitudinal passage defined by an elongated housing having side and end walls and supporting pairs of transporter sections positioned above and below and extending laterally across said longitudinal passage;
   b. introducing a pressurized gaseous transport medium through said transporter sections and into said longitudinal passage;
   c. injecting a pressurized processing medium into a processing chamber, defined beneath said substrates and tape intermediate pairs of said transporters, while continuously removing gaseous transport medium and pressurized processing medium; and
   d. tensioning said tape accordingly as the heat of processing affects said tape.

2. Method of tensioning substrates during processing of substrates and tape comprising:
   a. advancing said substrates and tape through a longitudinal passage defined by an elongated housing having side and end walls and supporting pairs of transporter sections positioned above and below and extending laterally across said longitudinal passage;
   b. introducing a pressurized gaseous transport medium through said transporter sections and into said longitudinal passage;
   c. injecting a pressurized processing medium into a processing chamber intermediate pairs of said transporters, while continuously removing gaseous transport medium and pressurized processing medium; and d. compressing and stretching said longitudinal passage accordingly as heat of processing alters the dimensions of said longitudinal passage.

3. Method of tensioning during processing of substrates and tape comprising:
   a. advancing said substrates and tape through a longitudinal passage defined by an elongated housing having side and end walls and supporting pairs of transporter sections positioned above and below and extending laterally across said longitudinal passage;
   b. introducing a pressurized gaseous transport medium through said transporter sections and into said longitudinal passage;
   c. injecting a pressurized processing medium into a processing chamber intermediate pairs of said transporters, while continuously removing gaseous transport medium and pressurized processing medium;
   d. tensioning said tape, accordingly as the heat of processing affects said tape; and
   e. compressing and stretching said longitudinal passage accordingly as heat of processing alters the dimensions of said longitudinal passage.

4. Method of tensioning during processing of sutstrates and tape as in claim 1, including heating said transporter sections in the non-processing side of said housing, so as to balance the heat of processing.

5. Method of tensioning during processing of substrates and tape as in claim 4, including cooling by circulating with compressed gas above and below said longitudinal passage.

6. Method of tensioning substrates during processing of substrates and tape as in claim 2, wherein said stretching is greater than the maximum achievable stretching of said longitudinal passage as a result of temperature differences.

7. Method of tensioning during processing of substrates and tape as in claim 5, wherein a plurality of pairs of transporters are mounted upon frames supported within said longitudinal housing, each frame being compressible and stretchable, so as to offset temperature changes within said longitudinal passage.

8. Method of tensioning during processing of substrates and tape as in claim 7, wherein said tensioning means is by hydraulic means.

9. Method of tensioning during processing of substrates and tape as in claim 1, wherein said substrates are attched to said tape as a means of transport through said longitudinal passage.

10. Method of tensioning during processing of substrates and tape as in claim 9, wherein said tape is roughened as an aid to optimal heat transfer.

11. Method of tensioning during processing of substrates and tape as in claim 9, wherein said tape is oxidized on both sides.

12. Method of tensioning during processing of substrates and tape as in claim 3, wherein said tape together with said substrates functions as an electrode.

13. Method of tensioning during processing of substrates and tape as in claim 12, wherein said processing module includes a second electrode supported within said processing chamber so as to administer processing medium.

14. Method of tensioning during processing of substrates and tape as in claim 3, including pre-cleaning said tape prior to said processing.

15. Method of tensioning during processing of substrates and tape as in claim 3, including post-cleaning of said tape after processing.

16. Method of tensioning during processing of substrates and tape as in claim 9, including applying a thin adhesive layer upon said tape so as to secure said substrates.

17. Method of tensioning during processing of substrates and tape as in claim 1, wherein said transporter sections on the non-processing side of side tape are of greater width than the transporter sections of the processing side.

18. Method of tensioning during processing of substrates and tape as in claim 3, wherein said processing is by plasma, including aniosotropic and isotropic etchings.

* * * * *